(12) United States Patent
Sumita et al.

(10) Patent No.: US 6,558,812 B2
(45) Date of Patent: May 6, 2003

(54) LIQUID EPOXY RESIN COMPOSITION AND SEMICONDUCTOR DEVICE

(75) Inventors: Kazuaki Sumita, Gunma-ken (JP); Toshio Shiobara, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/955,930

(22) Filed: Sep. 20, 2001

(65) Prior Publication Data
US 2002/0077421 A1 Jun. 20, 2002

(30) Foreign Application Priority Data
Sep. 22, 2000 (JP) ......................................... 2000-288250

(51) Int. Cl.$^7$ ............................................. H01L 29/12
(52) U.S. Cl. ..................... 428/620; 523/466; 528/89; 528/94; 528/112; 528/115
(58) Field of Search .................. 428/620; 523/466; 528/89, 94, 112, 115

(56) References Cited

U.S. PATENT DOCUMENTS 4,923,637 A * 5/1990 Yagi ........................... 252/511
4,954,602 A * 9/1990 Akutagawa ................... 528/93
6,225,704 B1   5/2001 Sumita et al.

OTHER PUBLICATIONS

Registry File Printout, RN16726–03–7, Chem. Abstracts, 2002.*

* cited by examiner

Primary Examiner—Robert Dawson
Assistant Examiner—D. Aylward
(74) Attorney, Agent, or Firm—Birch, Stewart, Kolasch & Birch, LLP

(57) ABSTRACT

A liquid epoxy resin composition comprising (A) a liquid epoxy resin, (B) a curing agent, (C) a curing accelerator, and (D) an inorganic filler is provided, the curing agent (B) comprising 5 to 75 parts by weight of a mixture of 3,4-dimethyl-6-(2-methyl-1-propenyl)-1,2,3,6-tetrahydrophthalic acid and 1-isopropyl-4-methyl-bicyclo[2.2.2]oct-5-ene-2,3-dicarboxylic acid per 100 parts by weight of the entire curing agent. The composition is adherent to the surface of silicon chips, and especially to polyimide resins and nitride films and has high thermal shock resistance. A semiconductor device sealed with the cured epoxy resin composition remains reliable.

7 Claims, 1 Drawing Sheet

LIQUID EPOXY RESIN COMPOSITION AND SEMICONDUCTOR DEVICE

This invention relates to a liquid epoxy resin composition which cures into a cured product having improved adhesion to the surface of silicon chips and especially photosensitive polyimide resins and nitride films, high humidity resistance, and stability against thermal shocks. It also relates to a semiconductor device which is sealed with the cured product of the liquid epoxy resin composition.

BACKGROUND OF THE INVENTION

The trend toward smaller sizes, lighter weights and increased capabilities in electrical equipment has led to a shift in the dominant semiconductor mounting process from pin insertion to surface mounting. Progress of semiconductor devices toward a higher degree of integration entails the enlargement of dies having a size as large as 10 mm or more per side. For semiconductor devices using such large size dies, attention is paid to the problems that greater stresses are applied to the die and the sealant during solder reflow, separation occurs at the interface between the sealant and the die or substrate, and the package cracks upon substrate mounting.

Liquid epoxy resin compositions which are the common prior art sealants are less adherent to the surface of silicon chips and especially photosensitive polyimide resins and nitride films. In the semiconductor art, there remains a need for improving adhesion to such materials. Under the circumstances, phthalic anhydrides and analogous acid anhydrides are often used as the curing agent in liquid epoxy resin compositions. However, the phthalic anhydrides and analogues are hygroscopic and suffer from several problems. Prior to curing, a phenomenon occurs that the penetration varies or even ceases midway due to a viscosity rise resulting from moisture absorption. The prior art acid anhydrides readily take up water prior to curing, and promote hydrolysis even after curing. Such moisture absorption causes a volume expansion, which can increase the electrical resistance at the interface between solder bumps and leads in flip-chip type semiconductor devices, giving rise to a reliability problem.

SUMMARY OF THE INVENTION

An object of the invention is to provide a liquid epoxy resin composition which cures into a cured product that has improved adhesion to the surface of silicon chips and especially photosensitive polyimide resins and nitride films, does not deteriorate under hot humid conditions as encountered in PCT (120° C./2.1 atm), and does not peel or crack over several hundred cycles of thermal cycling between −65° C. and 150° C. Another object of the invention is to provide a semiconductor device which is sealed with the cured product of the liquid epoxy resin composition.

The invention pertains to a liquid epoxy resin composition comprising (A) a liquid epoxy resin, (B) a curing agent, (C) a curing accelerator, and (D) an inorganic filler. We have been found that by blending as the curing agent (B) a mixture of 3,4-dimethyl-6-(2-methyl-1-propenyl)-1,2,3,6-tetrahydrophthalic acid and 1-isopropyl-4-methyl-bicyclo[2.2.2]oct-5-ene-2,3-dicarboxylic acid in an amount of 5 to 75 parts by weight per 100 parts by weight of the entire curing agent, there is obtained a liquid epoxy resin composition that is effectively adherent to the surface of silicon chips and especially photosensitive polyimide resins and nitride films, remains intact under hot humid conditions as encountered in PCT (120° C./2.1 atm), and is fully resistant to thermal shocks, so that it is suited as a sealant for large die size semiconductor devices.

Particularly, 3,4-dimethyl-6-(2-methyl-1-propenyl)-1,2,3,6-tetrahydrophthalic acid and 1-isopropyl-4-methyl-bicyclo[2.2.2]oct-5-ene-2,3-dicarboxylic acid are per se known as the curing agent for liquid epoxy resins. However, these compounds are used as the curing agent in few liquid epoxy resin compositions because they, when used alone, provide epoxy resin compositions with a high viscosity and give cured products which are brittle. Quite unexpectedly, we have found that when the curing agent is formulated by blending a mixture of 3,4-dimethyl-6-(2-methyl-1-propenyl)-1,2,3,6-tetrahydrophthalic acid and 1-isopropyl-4-methyl-bicyclo[2.2.2]oct-5-ene-2,3-dicarboxylic acid with another curing component in a specific proportion, and preferably selecting the other curing component from acid anhydrides that ensures formation of tough cured products, the resulting liquid epoxy resin composition is dramatically improved in adhesion to the silicon chip surface and thermal shock resistance, exhibits satisfactory properties even under hot humid conditions, and is best suited as a sealant for large die size semiconductor devices.

Accordingly, the invention provides a liquid epoxy resin composition comprising (A) a liquid epoxy resin, (B) a curing agent, (C) a curing accelerator, and (D) an inorganic filler as essential components. The curing agent (B) contains 5 to 75 parts by weight of a mixture of 3,4-dimethyl-6-(2-methyl-1-propenyl)-1,2,3,6-tetrahydrophthalic acid and 1-isopropyl-4-methyl-bicyclo[2.2.2]oct-5-ene-2,3-dicarboxylic acid per 100 parts by weight of the entire curing agent.

BRIEF DESCRIPTION OF THE DRAWING

The only FIGURE.

DESCRIPTION OF THE PREFERRED EMBODIMENTS

Figure 1:
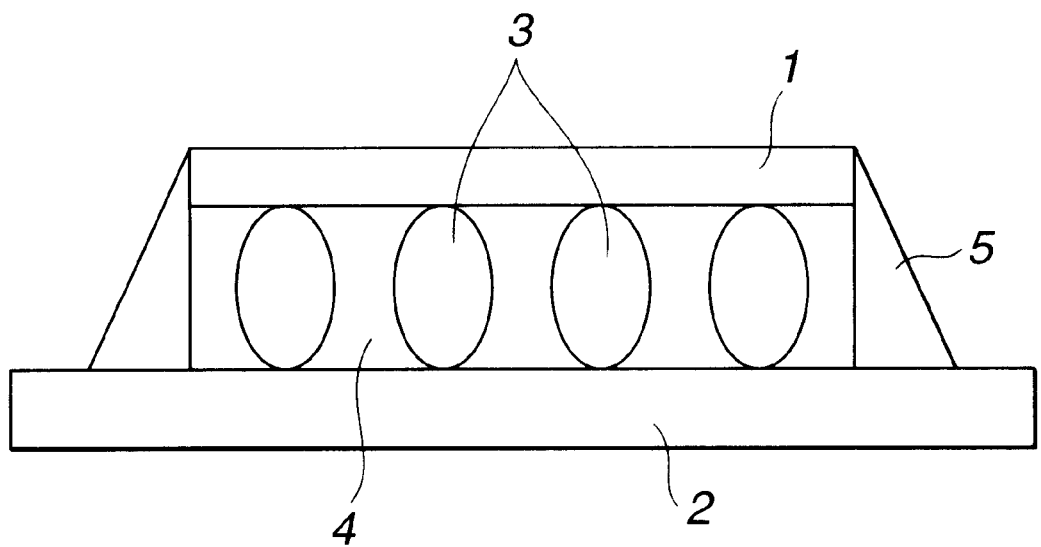
FIG. 1 is a schematic view of a flip chip-type semiconductor device according to one embodiment of the invention.

Component (A) in the liquid epoxy resin composition is a liquid epoxy resin that is not critical with respect to molecular structure or molecular weight so long as it has at least two epoxy groups per molecule. Illustrative examples include bisphenol-type epoxy resins such as bisphenol A epoxy resin and bisphenol F epoxy resin, novolac-type epoxy resins such as phenolic novolac epoxy resin and cresol novolac epoxy resin, triphenolalkane-type epoxy resins such as triphenolmethane epoxy resin and triphenolpropane epoxy resin, phenolaralkyl-type epoxy resins, biphenylaralkyl-type epoxy resins, stilbene-type epoxy resins, naphthalene-type epoxy resins, biphenyl-type epoxy resins and cyclopentadiene-type epoxy resins. These epoxy resins may be used singly or as mixtures of two or more thereof.

Of these, preferred are liquid epoxy resins which have at least two epoxy groups per molecule and are liquid at room temperature (e.g., 25° C.). Epoxy resins of the following structures may be added to these epoxy resins, provided such addition does not adversely affect penetrability of the composition.

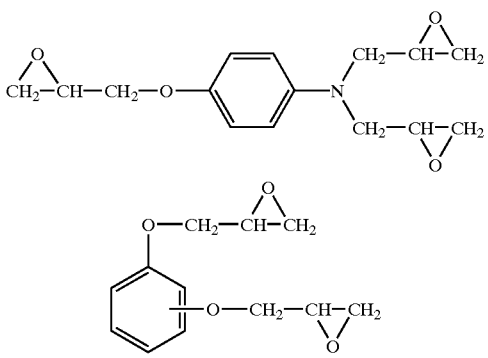

The liquid epoxy resin preferably has a total chlorine content of not more than 1,500 ppm, and especially not more than 1,000 ppm. When chlorine is extracted from the epoxy resin with water at an epoxy resin concentration of 50% and a temperature of 100° C. over a period of 20 hours, the water-extracted chlorine content is preferably not more than 10 ppm. At a total chlorine content of more than 1,500 ppm or a water-extracted chlorine level of more than 10 ppm, the reliability of the sealed semiconductor device, particularly in the presence of moisture, may be compromised.

The curing agent (B) used herein contains 5 to 75 parts, preferably 10 to 70 parts, and more preferably 20 to 70 parts by weight of a mixture of 3,4-dimethyl-6-(2-methyl-1-propenyl)-1,2,3,6-tetrahydrophthalic acid and 1-isopropyl-4-methyl-bicyclo[2.2.2]oct-5-ene-2,3-dicarboxylic acid per 100 parts by weight of the entire curing agent. Less than 5 parts by weight of the mixture fails to improve the adhesion and the stability under hot humid conditions as in PCT. More than 75 parts by weight of the mixture helps to improve the adhesion, but allows cracks to occur in thermal shock and other tests.

With respect to the mixing proportion of 3,4-dimethyl-G-(2-metyl-1-propenyl)-1,2,3,6-tetrahydrophthalic acid and 1-isopropyl-4-methyl-bicyclo[2.2.2]oct-5-ene-2,3-dicarboxylic acid, the preferred mixtures consist of 20 to 60% by weight of the former and 80 to 40% by weight of the latter provided that the total is 100% by weight. Mixtures consisting of 30 to 50% by weight of the former and 70 to 50% by weight of the latter are more preferred. These (curing agent) mixtures are commercially available, for example, under the trade name YH307 from Yuka Shell Expoxy Co., Ltd.

The other curing component to be admixed with the aforementioned mixture to provide the curing agent (B) is not critical. Any of curing agents customarily used in curable epoxy resin compositions may be employed. Illustrative of the other curing component are art-recognized curing agents such as phenolic resins, acid anhydrides, amine compounds and imidazole compounds. Preferred among others are acid anhydrides which are liquid at room temperature (25° C.).

Preferred acid anhydrides include those having on the molecule one or two aliphatic or aromatic rings, one or two acid anhydride groups (e.g., —CO—O—CO—), and about 4 to 25 carbon atoms, and especially about 8 to 20 carbon atoms. Such acid anhydrides are exemplified by-tetrahydrophthalic anhydride, methyltetrahydrophthalic anhydride, methylhexahydrophthalic anhydride, hexahydrophthalic anhydride, methylhymic anhydride, pyromellitic dianhydride, maleinized alloocimene, benzophenonetetracarboxylic dianhydride, 3,3',4,4'-biphenyltetracarboxylic dianhydride, bis(3,4-dicarboxyphenyl)ether dianhydride, bis (3,4-dicarboxyphenyl)-methane dianhydride and 2,2-bis(3,4-dicarboxyphenyl)propane dianhydride. Of these, tetrahydrophthalic anhydride, methyltetrahydrophthalic anhydride, methylhexahydrophthalic anhydride, and hexahydrophthalic anhydride are especially preferred. They are used singly or in combination.

The other curing agents that may be used herein include also carboxylic acid hydrazides such as dicyandiamide, adipic acid hydrazide and isophthalic acid hydrazide.

The curing agent obtained by admixing the aforementioned mixture with the other curing component is included in an effective amount to cure the epoxy resin, which varies with the type of curing agent. If the other curing agent is an acid anhydride, the molar ratio of carboxyl groups derived from acid anhydride groups (—CO—O—CO—) in the curing agent per mole of epoxy groups on the epoxy resin is preferably from 0.5 to 1.5. At a molar ratio of less than 0.5, the curability may be inadequate. On the other hand, at a molar ratio greater than 1.5, unreacted acid anhydride may remain, possibly resulting in a lower glass transition temperature. A molar ratio within a range of 0.8 to 1.2 is especially preferred. Alternatively, for substantially the same reasons, an acid anhydride may be incorporated such that the molar ratio of acid anhydride groups in the acid anhydride per mole of epoxy groups on the epoxy resin is in a range of preferably 0.3 to 0.7, and most preferably 0.4 to 0.6.

In the inventive composition, the curing or reaction accelerator (C) is blended for the purpose of accelerating curing reactions of the epoxy resin (A) with the curing agent (B). The curing accelerator is not critical as long as it can accelerate curing reactions, and any well-known ones may be used. For example, one or more compounds selected from among imidazole compounds, tertiary amine compounds and organophosphorus compounds may be used as the curing accelerator. Of these, imidazole compounds and organophosphorus compounds are preferred.

The imidazole compounds that may be used herein include those of the following general formula (1).

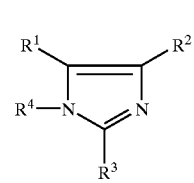

(1)

In the formula (1), $R^1$ and $R^2$ are each independently a hydrogen atom or a substituted or unsubstituted monovalent hydrocarbon group of 1 to 12 carbon atoms, examples of which include alkyls, substituted alkyls and aryls such as methyl, ethyl, hydroxymethyl and phenyl. $R^3$ is a substituted or unsubstituted monovalent hydrocarbon group of 1 to 12 carbon atoms, examples of which include alkyls, alkenyls and aryls such as methyl, ethyl, phenyl and allyl. $R^4$ is a hydrogen atom, a substituted or unsubstituted monovalent hydrocarbon group of 1 to 12 carbon atoms, examples of which include alkyls, substituted alkyls and aralkyls such as methyl, ethyl, cyanoethyl and benzyl, or a group of formula (2) below.

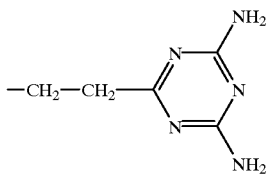

(2)

The substituted monovalent hydrocarbon groups mentioned above include hydroxy-substituted and cyano-substituted monovalent hydrocarbon groups.

Examples of suitable imidazole compounds include 2-methylimidazole, 2-ethylimidazole, 1,2-dimethylimidazole, 1,2-diethylimidazole, 2,4-dimethylimidazole, 2-ethyl-4-methylimidazole, 2-undecylimidazole, 2-heptadecylimidazole, 2-phenylimidazole, 1-benzyl-2-methylimidazole, 1-benzyl-2-phenylimidazole, 1-cyanoethyl-2-methylimidazole, 1-cyanoethyl-2-undecylimidazole, 2,4-diamino-6-[2'-methyl-imidazolyl-(1)']-ethyl-S-triazine, 2,4-diamino-6-[2'-ethyl-4'-methylimidazolyl-(1)']-ethyl-S-triazine, 2,4-diamino-6-[2'-undecylimidazolyl]-ethyl-S-triazine, the isocyanuric acid addition product of 2,4-diamino-6-[2'-methylimidazolyl-(1)']-ethyl-S-triazine, 2-phenyl-4-methyl-5-hydroxymethyl-imidazole, 2-phenyl-4,5-dihydroxymethylimidazole, and 2-aryl-4,5-diphenylimidazoles. Of these, 2-methylimidazole, 2-ethylimidazole, 1,2-dimethylimidazole, 1,2-diethylimidazole, 2-ethyl-4-methylimidazole, 2-undecylimidazole, 2-heptadecylimidazole, and 2-phenylimidazole are preferred.

Suitable tertiary amine compounds include amine compounds having alkyl or aralkyl substituents bonded to the nitrogen atom, such triethylamine, benzyldimethylamine, benzyltrimethylamine and α-methylbenzyldimethylamine; cycloamidine compounds or organic acid salts thereof, such as 1,8-diazabicyclo[5.4.0]undec-7-ene and its phenol, octanoic acid and oleic acid salts; and salts or complex salts of cycloamidine compounds with quaternary boron compounds, such as the compound of the following formula.

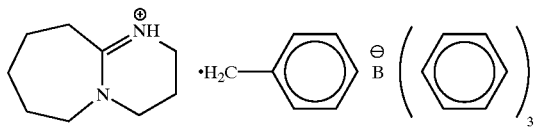

Suitable organophosphorus compounds include triorganophosphines such as triphenylphosphine, tributylphosphine, tri(p-methylphenyl)phosphine, tri(nonylphenyl)phosphine, and diphenyltolylphoshine; triorganophosphine-triorganoborane salts such as triphenylphosphine triphenylborane; and tetraorganophosphonium tetraorganoborate salts such as tetraphenylphosphonium tetraphenylborate, and derivatives thereof. Of these, organophosphine compounds of general formula (3) below are preferred.

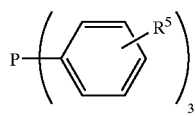

(3)

In formula (3), $R^5$ is a hydrogen atom or an alkyl or alkoxy group of 1 to 4 carbon atoms. Examples of suitable alkyl groups include methyl, ethyl, propyl, isopropyl, butyl, isobutyl and tert-butyl. Examples of suitable alkoxy groups include methoxy and ethoxy. $R^5$ is preferably hydrogen or methyl.

Examples of formula (3) compounds include the following.

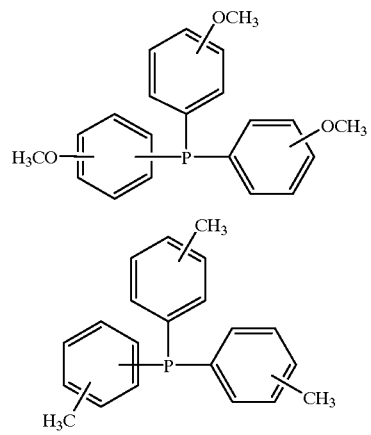

The curing accelerator may be blended as such, but preferably in microcapsule form. Since microcapsules containing the curing accelerator, typically an imidazole compound or an organophosphorus compound are more stable at high temperatures, the epoxy resin composition even loaded with a large amount of an inorganic filler is given a low viscosity enough to penetrate into narrow gaps, by heating the semiconductor device at a high temperature. Then the composition is a sealant which is effective especially as an underfill material in flip chip-type semiconductor devices having large size dies.

The microcapsules employed in the invention use as the shell material a polymer composed of (meth)acrylic monomers such as $C_{1-8}$ alkyl esters of acrylic acid, itaconic acid, methacrylic acid or crotonic acid, or $C_{1-8}$ alkyl esters of the same type in which the alkyl groups have substituents such as allyl groups; monofunctional monomers such as styrene, α-methylstyrene, acrylonitrile, methacrylonitrile or vinyl acetate; and polyfunctional monomers such as ethylene glycol di(meth)acrylate, polyethylene glycol di(meth)acrylate, divinylbenzene, bisphenol A di(meth)acrylate and methylenebis(meth)acrylamide. The imidazole compound and/or organophosphorus compound serving as the catalyst is enclosed within the polymer. Of the above polymers, polymers of (meth)acrylic monomers are preferred.

A variety of methods may be used to produce the above-described microcapsules containing an imidazole compound and/or organophosphorus compound as the curing catalyst (or curing accelerator). The use of a method known to the art, such as suspension polymerization or emulsion polymerization, is advantageous for the efficient production of microcapsules of good sphericity.

To obtain what would normally be considered a high-concentration microencapsulated catalyst, based on the molecular structure of the catalyst, the above-described monomer is used in an overall amount of preferably about 10 to 200 parts by weight, more preferably 10 to 100 parts by weight, and most preferably 20 to 50 parts by weight, per 10 parts by weight of the curing catalyst. Less than 10 parts by weight of the monomer may be difficult to impart sufficient latency. On the other hand, the use of more than 200 parts by weight of the monomer lowers the proportion of catalyst, which may make it necessary to use a large amount of microencapsulated catalyst to achieve sufficient curability and can therefore be economically undesirable.

The microcapsules produced by the foregoing process typically have an average particle size of 0.5 to 10 µm, and preferably 2 to 5 µm. The maximum particle size is preferably no greater than 50 µm, and most preferably no greater than 20 µm. At an average particle size of less than 0.5 µm, the microcapsules may be too small in diameter or too large in specific surface area, the incorporation of a large amount of microcapsules in the composition may increase the viscosity thereof, and the catalyst may have insufficient latency. On the other hand, at an average particle size greater than 10 µm, dispersion in the resin component may become non-uniform, leading to a decline in the reliability.

The microencapsulated catalyst used herein preferably has a performance such that, when 1 g of the curing catalyst-containing microcapsules is measured out and mixed into 30 g of o-cresol, the mixture is left to stand at 30° C. for 15 minutes, and the amount of catalyst that has dissolved out of the microcapsules is determined by gas chromatography, a catalyst dissolution from the microcapsules into o-cresol corresponds to at least 70 wt % (i.e., 70 to 100 wt %) of the total amount of catalyst in the microcapsules. At a catalyst dissolution of less than 70 wt %, a longer time may be necessary for curing, which may lower the efficiency of production. A dissolution of at least 75 wt % of the catalyst from the microcapsules is preferred.

The curing accelerator (especially, the non-encapsulated curing accelerator) is preferably included within the inventive composition in an amount of from 0.1 to 15 parts by weight, and more preferably 0.5 to 7 parts by weight, per 100 parts by weight of the liquid epoxy resin (A) and the curing agent (B) combined. Less than 0.1 part by weight of the curing accelerator may fail to accelerate curing whereas the use of more than 15 parts by weight of the curing accelerator provides excellent cure, but tends to invite an undesirable loss in shelf stability. Notably the microencapsulated catalyst is preferably included in an amount of 1 to 15 parts, and more preferably 2 to 10 parts by weight per 100 parts by weight of the liquid epoxy resin (A) and the curing agent (B) combined. Less than 1 part by weight may fail to accelerate curing whereas the use of more than 15 parts by weight provides excellent cure, but tends to invite an undesirable loss in shelf stability.

It is acceptable to add the non-encapsulated curing accelerator in admixture with the microencapsulated catalyst. Their addition amount is preferably 1 to 15 parts, more preferably 2 to 10 parts by weight in total.

As the inorganic filler (D), any inorganic filler known to be useful for lowering the expansion coefficient may be employed. Specific examples include fused silica, crystalline silica, alumina, boron nitride, aluminum nitride, silicon nitride, magnesia, magnesium silicate and aluminum. Of these, spherical fused silica is desirable for achieving a low viscosity.

When the liquid epoxy resin composition is used as a potting material, the inorganic filler desirably has an average particle size of 2 to 25 µm, more preferably 3 to 20 µm, and a maximum particle size of preferably up to 75 µm, more preferably up to 50 µm. A filler with an average particle size of less than 2 µm may provide an increased viscosity and cannot be loaded in large amounts. An average particle size of more than 25 µm means the inclusion of a more proportion of coarse particles which will catch on lead wires, causing voids.

An appropriate amount of the filler included in the composition is in a range of 100 to 600 parts by weight per 100 parts by weight of the epoxy resin (A), the curing agent (B) and an optional flexibilizer (to be described later) combined. At less than 100 parts by weight, the expansion coefficient tends to be too large, which may induce cracks in a thermal cycling test. On the other hand, at more than 600 parts by weight, the viscosity rises, which may bring about a decline in flow.

To obtain a sealant for underfilling which exhibits both improved penetration and a lower linear expansion, it is advantageous to include a filler having an average particle size at most about one-tenth as large and a maximum particle size at most one-half as large as the size of the gap between the substrate and chip in a flip chip semiconductor device. The amount of such filler included in the sealant is in a range of preferably 50 to 400 parts by weight, and especially 100 to 250 parts by weight, per 100 parts by weight of the epoxy resin (A) and the curing agent (B) combined. At less than 50 parts by weight, the expansion coefficient tends to be too large, which may induce cracks in a thermal cycling test. On the other hand, at more than 400 parts by weight, the viscosity rises, which may bring about a decline in the thin-film penetration properties. The inorganic filler typically has a maximum particle size of preferably up to 50 µm, more preferably up to 45 µm, and most preferably up to 30 µm. The average particle size of the filler is generally up to 10 µm, preferably from 0.5 to 10 µm, more preferably from 1 to 5 µm, and most preferably from 1 to 3 µm. The maximum particle size and average particle size may be obtained by particle size distribution measurement involving laser diffraction analysis. The average particle size may be suitably determined as the weight average value, or median diameter.

In the practice of the invention, preliminary surface treatment of the inorganic filler with a coupling agent such as a silane coupling agent or a titanate coupling agent is advantageous for further improving the low moisture absorption, impact resistance and crack resistance of the cured product.

Suitable coupling agents are silane coupling agents including epoxy functional group-bearing alkoxysilanes such as γ-glycidoxypropyltrimethoxysilane, γ-glycidoxypropylmethyldiethoxysilane and β-(3,4-epoxycyclohexyl)ethyltrimethoxysilane; amino functional group-bearing alkoxysilanes such as N-β-(aminoethyl)-γ-aminopropyltrimethoxysilane, γ-aminopropyltriethoxysilane and N-phenyl-γ-aminopropyltrimethoxysilane; and mercapto functional group-bearing alkoxysilanes such as γ-mercaptopropyltrimethoxysilane. No particular limitation is imposed on the amount of coupling agent and method used in surface treatment.

The composition of the invention may include also a flexibilizer to lower stress. Suitable examples include silicone rubbers, silicone oils, liquid polybutadiene rubbers, and thermoplastic resins such as methyl methacrylate-butadiene-styrene copolymers. Preferably, the flexibilizer is a copolymer of an epoxy resin or phenolic resin with an organopolysiloxane, more specifically a copolymer prepared by the addition reaction of the alkenyl groups within an alkenyl group-bearing epoxy resin or phenolic resin with the SiH groups (that is, hydrogen atoms bonded to silicon atoms) in an organohydrogenpolysiloxane of formula (4) below having 20 to 400, and preferably 40 to 200, silicon atoms and having 1 to 5, preferably 2 to 4, and most preferably 2, SiH groups per molecule.

$$H_a R_b SiO_{(4-a-b)/2} \quad (4)$$

In formula (4), R is a substituted or unsubstituted monovalent hydrocarbon group, "a" is a positive number from 0.002 to 0.1, "b" is a positive number from 1.8 to 2.2, and the sum a+b is from 1.81 to 2.3.

The monovalent hydrocarbon group represented by R preferably has 1 to 10 carbons, and especially 1 to 8 carbons. Illustrative examples include alkyl groups such as methyl, ethyl, propyl, isopropyl, butyl, isobutyl, tert-butyl, hexyl, cyclohexyl, octyl and decyl; alkenyl groups such as vinyl, allyl, propenyl, butenyl and hexenyl; aryl groups such as phenyl, xylyl and tolyl; aralkyl groups such as benzyl, phenylethyl and phenylpropyl; and halogenated monovalent hydrocarbon groups in which some or all of the hydrogen atoms on the hydrocarbon groups have been substituted with halogen atoms (e.g., chlorine, fluorine, bromine), such as chloromethyl, bromoethyl and trifluoropropyl.

Copolymers having one of the following structures are preferred.

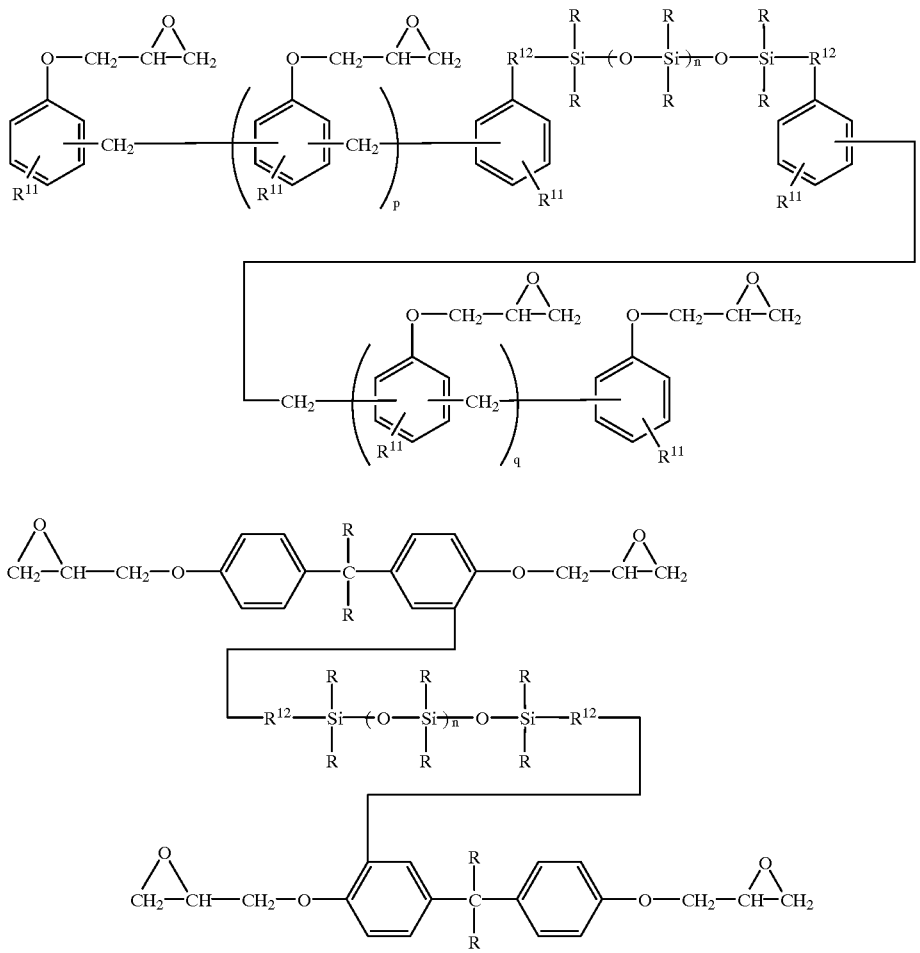

In the above formulas, R is as defined above, $R^{11}$ is a hydrogen atom or an alkyl of 1 to 4 carbons, and $R^{12}$ is —$CH_2CH_2CH_2$—, —$OCH_2$—$CH(OH)$—$CH_2$—O—$CH_2CH_2CH_2$— or —O—$CH_2CH_2CH_2$—. The letter n is an integer from 8 to 398, and preferably from 38 to 198, p is an integer from 1 to 10, and q is an integer from 1 to 10.

The above-described copolymer is included in the inventive composition such that the amount of diorganopolysiloxane units is 0 to 20 parts by weight, and preferably 2 to 15 parts by weight, per 100 parts by weight of the liquid epoxy resin (A) and the curing agent (B) combined, whereby stress can be further reduced.

If necessary, the liquid epoxy resin composition may contain also other additives. Suitable additives include carbon-functional silanes for improving adhesion, antioxidants, and surface treating agents (e.g., silane coupling agents such as γ-glycidoxypropyltrimethoxysilane).

The liquid epoxy resin composition of the invention may be prepared by the simultaneous or discrete stirring, melting, mixing or dispersion of the epoxy resin, curing agent, curing accelerator and inorganic filler as well as optional components such as flexibilizer, while carrying out heat treatment if necessary. No particular limitation is imposed on the apparatus used for mixing, stirring, dispersing and otherwise processing the mixture of components. Exemplary apparatus suitable for this purpose include an automated mortar, three-roll mill, ball mill and planetary mixer which is equipped with an agitator and a heater. Use can also be made of suitable combinations of these apparatuses.

The liquid epoxy resin composition of the invention is used as a potting or coating material in the sealing of semiconductor devices, and best suited as an underfill material for flip-chip type semiconductor devices.

Preferably the liquid epoxy resin composition for used as a sealant has a viscosity of less than about 10,000 poises at 25° C. An ordinary molding method and ordinary molding conditions may be employed when sealing semiconductor devices with the inventive composition. It is preferable to carry out an initial hot oven cure at about 100 to 120° C. for at least about ½ hour, followed by a subsequent hot oven cure at about 150° C. for at least about ½ hour. Initial curing conditions below the above-mentioned temperature and time may result in void formation after curing, and post-curing conditions below the temperature and time indicated above may yield a cured product having undesirable properties.

The semiconductor devices to be sealed with the inventive composition are typically flip chip-type semiconductor devices. Referring to FIG. 1, the flip chip-type semiconductor device includes an organic substrate 2 having an interconnect pattern side on which is mounted a semiconductor chip 1 over a plurality of intervening bumps 3. The gap between the organic substrate 2 and the semiconductor chip 1 (shown in the diagram as gaps between the bumps 3) is filled with an underfill material 4, and the lateral edges of the gap are sealed with a fillet material 5. The inventive composition is especially suitable in forming the underfill material in the above-described flip-chip type semiconductor device which has not been cleaned of flux.

When the inventive composition is used as an underfill material, the cured product preferably has an expansion coefficient of 20 to 40 ppm/° C. below the glass transition temperature. Sealant used as the fillet material may be a conventional material known to the art. The use as the fillet of a liquid epoxy resin composition of the same general type as that described above is especially preferred, although the cured product in this case preferably has an expansion coefficient of 10 to 20 ppm/° C. below the glass transition temperature.

EXAMPLES

Examples of the invention and comparative examples are given below by way of illustration, and are not intended to limit the invention.

Examples 1 to 5 and Comparative Examples 1 to 3

The components shown in Table 1 were blended to uniformity on a three-roll mill to give eight epoxy resin compositions. These epoxy resin compositions were examined by the following tests. The results are also shown in Table 1.

Viscosity

The viscosity at 25° C. was measured using a BH-type rotary viscometer at a rotational speed of 4 rpm.

Gelation Time

The gelation time for the composition was measured on a 150° C. hot plate.

Glass Transition Temperature (Tg)

Using a sample of cured material measuring 5×5×15 mm, the glass transition temperature was measured with a thermomechanical analyzer at a heating rate of 5° C./min.

Coefficients of Thermal Expansion

In the measurement of the glass transition temperature described above, the coefficient of thermal expansion below the Tg (CTE-1) was determined for a temperature range of 50 to 80° C., and the coefficient of thermal expansion above the Tg (CTE-2) was determined for a temperature range of 200 to 230° C.

Adhesion Test

On a silicon chip coated with photosensitive polyimide, the composition was molded and cured at 150° C. for 3 hours to form a frustoconical test piece having a top diameter of 2 mm, a bottom diameter of 5 mm and a height of 3 mm. After curing, the test piece was measured for shear bond strength (initial). The test piece was held in a pressure cooker test (PCT) environment of 121° C. and 2.1 atm. where the test piece was moistened for 168 hours. After moistening, the test piece was measured for shear bond strength again. In each example, five test pieces were used and the bond strength reported was an average thereof.

PCT Delamination Test

A polyimide-coated 10×10 mm silicon chip was stacked on a 30×30 mm FR-4 substrate using spacers of approximately 100 μm thick, leaving a gap therebetween. An epoxy resin composition was introduced into the gap and cured at 150° C. for 4 hours. The assembly was then placed in a PCT environment of 121° C. and 2.1 atm for 168 hours. At the end of the test, the assembly was checked for delamination by C-SAM.

Thermal Shock Test

A polyimide-coated 10×10 mm silicon chip was stacked on a 30×30 mm FR-4 substrate using spacers of approximately 100 μm thick, leaving a gap therebetween. An epoxy resin composition was introduced into the gap and cured at 150° C. for 4 hours. The test sample was subjected to thermal cycling between −65° C./30 min and 150° C./30 min. After 250, 500 and 750 thermal cycles, the resin was checked for delamination and cracks.

TABLE 1

| Component | Example | | | | Comparative Example | | | | |
|---|---|---|---|---|---|---|---|---|---|
| (pbw) | 1 | 2 | 3 | 4 | 1 | 2 | 3 | 4 | 5 |
| RE410 | 55 | 50 | 52 | 50 | 45 | 52 | 53 | 50 | 53 |
| MH700 | 15 | 25 | 36 | 25 | | 46 | 47 | 10 | 47 |
| YH307 | 30 | 25 | 12 | 25 | 55 | 2 | | 40 | |
| SE8FC | 150 | 150 | 150 | 150 | 150 | 150 | 150 | 150 | 150 |
| KBM403 | 1.0 | 1.0 | 1.0 | 1.0 | 1.0 | 1.0 | 1.0 | 1.0 | 1.0 |
| Copolymer | 4 | 4 | 4 | 4 | 4 | 4 | 4 | 4 | 4 |

TABLE 1-continued

| Component | Example | | | | Comparative Example | | | | |
|---|---|---|---|---|---|---|---|---|---|
| (pbw) | 1 | 2 | 3 | 4 | 1 | 2 | 3 | 4 | 5 |
| 2E4MZ | | | | 1 | | | | | 1 |
| Microencapsulated 2E4MZ | 5 | 5 | 5 | | 5 | 5 | 5 | 5 | |
| Viscosity at 25° C. (Pa · s) | 22.2 | 19.8 | 15.2 | 23.3 | 33.5 | 11.4 | 10.7 | 24.2 | 13.5 |
| Gelation time at 150° C. (s) | 73 | 75 | 78 | 55 | 74 | 76 | 77 | 78 | 50 |
| Tg (° C.) | 140 | 142 | 145 | 137 | 145 | 140 | 138 | 138 | 142 |
| CTE-1 (ppm/° C.) | 34 | 33 | 32 | 32 | 35 | 31 | 30 | 34 | 30 |
| CTE-2 (ppm/° C.) | 122 | 118 | 118 | 115 | 118 | 116 | 114 | 113 | 112 |
| PCT delamination test | no delamination | no delamination | no delamination | no delamination | no delamination | delaminated | delaminated | no delamination | delaminated |
| Bond strength (kgf/cm$^2$) | | | | | | | | | |
| Initial | 108 | 102 | 105 | 100 | 98 | 102 | 104 | 88 | 97 |
| After 168 hr PCT | 89 | 78 | 77 | 182 | 85 | 25 | 0 | 68 | 0 |
| Rejection (%) after thermal shock test | | | | | | | | | |
| 250 cycles | 0 | 0 | 0 | 0 | 75 | 0 | 0 | 15 | 0 |
| 500 cycles | 0 | 0 | 0 | 0 | 100 | 5 | 0 | 75 | 5 |
| 750 cycles | 5 | 0 | 0 | 10 | | 5 | 0 | 100 | 10 |

Components:

RE410: bisphenol A-type epoxy resin (Nippon Kayaku Co., Ltd.)

MH700: methyltetrahydrophthalic anhydride (Shin-Nippon Rika Co., Ltd.)

YH307: a mixture of 3,4-dimethyl-6-(2-methyl-1-propenyl)-1,2,3,6-tetrahydrophthalic acid and 1-isopropyl-4-methyl-bicyclo[2.2.2]oct-5-ene-2,3-dicarboxylic acid (Yuka Shell Epoxy Co., Ltd.)

KBM403: silane coupling agent γ-glycidoxypropyltrimethoxy-silane (Shin-Etsu Chemical Co., Ltd.)

SE8FC: spherical silica with maximum particle size $\geq 24$ μm and average particle size 8 μm (Tokuyama Soda Co., Ltd.)

2E4MZ: 2-ethyl-4-methylimidazole (Shikoku Chemical Corp.)

Microencapsulated 2E4MZ: A methyl methacrylate polymer which contains 20 wt % of 2E4MZ. Average particle size, 7 μm. Amount of catalyst which dissolves from microcapsules during 15 minutes of treatment in o-cresol at 30° C., 87 wt %.

Copolymer: the addition reaction product of

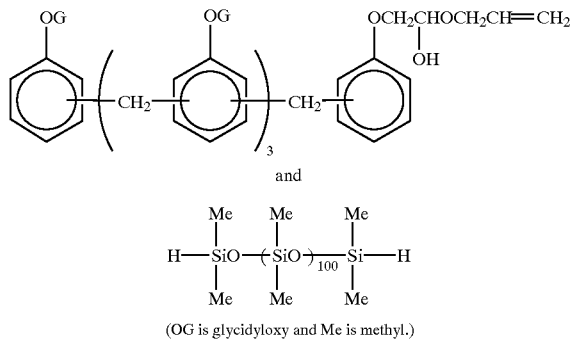

(OG is glycidyloxy and Me is methyl.)

There has been described a liquid epoxy resin composition which cures into a cured product having improved adhesion to the surface of silicon chips and especially to photosensitive polyimide resins and nitride films and highly resistant to thermal shocks and is thus best suited as a sealant for semiconductor devices having large size dies. These characteristics confer a very high reliability to semiconductor devices sealed with the inventive epoxy resin composition.

Japanese Patent Application No. 2000-288250 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A liquid epoxy resin composition comprising (A) a liquid epoxy resin, (B) a curing agent, (C) a curing accelerator which is an imidazole compound or an organophosphorus compound or both, and (D) an inorganic filler, said curing agent (B) comprising 5 to 75 parts by weight of a mixture of 3,4-dimethyl-6-(2-methyl-1-propenyl)-1,2,3,6-tetrahydrophthalic anhydride and 1-isopropyl-4-methyl-bicyclo[2.2.2]oct-5-ene-2,3-dicarboxylic anhydride per 100 parts by weight of the entire curing agent.

2. The composition of claim 1 wherein the other curing component used in combination with said mixture as said curing agent (B) is at least one selected from the group consisting of tetrahydrophthalic anhydride, methyltetrahydrophthalic anhydride, methylhexahydrophthalic anhydride, and hexahydrophthalic anhydride.

3. A liquid epoxy resin composition comprising (A) a liquid epoxy resin, (B) a curing agent, (C) a curing accelerator which is an imidazole compound or an organophosphorus compound or both, and (D) an inorganic filler, said curing agent (B) comprising 5 to 75 parts by weight of a mixture of 3,4-dimethyl-6-(2-methyl-1-propenyl)-1,2,3,6-tetrahydrophthalic anhydride and 1-isopropyl- 4-methyl-bicyclo[2.2.2]oct-5-ene-2,3-dicarboxylic anhydride per 100 parts by weight of the entire curing agent;

wherein said curing accelerator (C) is a microencapsulated catalyst containing an imidazole compound or an organophosphorus compound or both, having an average particle size of 0.5 to 10 μm, and having a catalyst dissolution from the microcapsules into o-cresol, as measured at 30° C. over a period of 15 minutes, which corresponds to at least 70% by weight of the total amount of catalyst in the microcapsules.

4. The composition of claim 1 wherein the imidazole compound is selected from the group consisting of 2-methylimidazole, 2-ethylimidazole, 1,2-dimethylimidazole, 1,2-diethylimidazole, 2,4-dimethylimidazole, 2-ethyl-4-methylimidazole, 2-undecylimidazole, 2-heptadecylimidazole, 2-phenylimidazole, 1-benzyl-2-methylimidazole, 1-benzyl-2-phenylimidazole, 1-cyanoethyl-2-methylimidazole 1-cyanoethyl-2-undecylimidazole, 2,4-diamino-6-[2'-methylimidazolyl(1)']-ethyl-S-triazine, 2,4-diamino-G-[2'-ethyl-4'-methylimidazolyl (1)']-ethyl-S-triazine, 2,4-diamino-6-[2'-undecylimidazolyl]-ethyl-S-triazine, 2,4-diamino-6-[2'-methylimidazolyl-(1)']-ethyl-S-triazine isocyanuric acid adduct, 2-phenyl-4-methyl-5-hydroxymethylimidazole, 2-phenyl-4,5-dihydroxymethylimidazole, and 2-aryl-4,5-diphenylimidazoles.

5. The composition of claim 4 wherein the imidazole compound is selected from the group consisting of 2-methylimidazole, 2-ethylimidazole, 1,2-dimethylimidazole, 1,2-diethylimidazole, 2-ethyl-4-methylimidazole, 2-undecylimidazole, 2-heptadecylimidazole, and 2-phenyl-imidazole.

6. A semiconductor device which is sealed with the cured product of the liquid epoxy resin composition of claim 1.

7. The semiconductor device of claim 6 which is of the flip chip type.

* * * * *